United States Patent
Dudeck et al.

(10) Patent No.: US 8,468,419 B2
(45) Date of Patent: Jun. 18, 2013

(54) HIGH-RELIABILITY MEMORY

(75) Inventors: Dennis E. Dudeck, Hazleton, PA (US);
Ross A. Kohler, Allentown, PA (US);
Richard J. McPartland, Nazareth, PA (US);
Hai Quang Pham, Hatfield, PA (US);
Wayne E. Werner, Coopersburg, PA (US)

(73) Assignee: LSI Corporation, San Jose, CA (US)

( * ) Notice: Subject to any disclaimer, the term of this patent is extended or adjusted under 35 U.S.C. 154(b) by 614 days.

(21) Appl. No.: 12/550,978

(22) Filed: Aug. 31, 2009

(65) Prior Publication Data
US 2011/0055660 A1    Mar. 3, 2011

(51) Int. Cl.
*G11C 29/00*    (2006.01)
(52) U.S. Cl.
USPC .......................................................... 714/763
(58) Field of Classification Search
USPC .......................................................... 714/763
See application file for complete search history.

(56) References Cited

U.S. PATENT DOCUMENTS

| | | | |
|---|---|---|---|
| 2003/0115518 A1* | 6/2003 | Kleveland et al. | 714/718 |
| 2007/0113150 A1* | 5/2007 | Resnick et al. | 714/763 |
| 2009/0070520 A1* | 3/2009 | Mizushima | 711/103 |
| 2010/0115217 A1* | 5/2010 | Oh et al. | 711/162 |
| 2010/0162037 A1* | 6/2010 | Maule et al. | 714/5 |
| 2011/0041016 A1* | 2/2011 | O'Connell | 714/711 |

* cited by examiner

*Primary Examiner* — Albert Decady
*Assistant Examiner* — Enam Ahmed
(74) *Attorney, Agent, or Firm* — Ryan, Mason & Lewis, LLP

(57) ABSTRACT

A memory circuit includes a memory including a plurality of primary memory elements, and an error correction circuit coupled to the memory and operative to detect an error in at least one of the primary memory elements and to provide corrected data corresponding to the primary memory element. The memory circuit further includes at least one spare memory element and a control circuit operative to replace at least one of the primary memory elements with the spare memory element as a function of results generated by the error correction circuit.

20 Claims, 2 Drawing Sheets

HIGH-RELIABILITY MEMORY

FIELD OF THE INVENTION

The present invention relates generally to the electrical, electronic, and computer arts, and more particularly relates to memory circuits.

BACKGROUND OF THE INVENTION

The reliability of an integrated circuit (IC) may be characterized by how many ICs fail over a specified time out of a specified population of ICs, often expressed in terms of the number of defective parts per million (dppm). For example, if five ICs failed out of a population of one million ICs during a prescribed lifetime of ten years, the reliability of those ICs may be expressed as five dppm. The reliability of components, including memory, within an IC can be similarly characterized. Thus, if five memories fail out of a population of one million memories during a lifetime of ten years, the reliability of those memories may be expressed as five dppm.

Failure mechanisms in a memory may be attributable to hard and/or soft errors. A soft error, being transient in nature, may occur only once or it may occur multiples times, but not necessarily every time the memory is operated (e.g., random or periodic errors). For instance, a memory cell may produce erroneous data when read because the data written into the cell has been corrupted by a nonrecurring or infrequent mechanism that is unlikely to corrupt data subsequently written into the same cell. An illustrative example of this soft error mechanism is a single event upset (SEU) occurring within a memory cell caused by radiation (e.g., an alpha particle, cosmic ray, electromagnetic pulse (EMP), etc.).

In contrast, a hard error is generally caused by a failure mechanism that is non-transient, typically causing consistently erroneous reads from a memory cell written with at least one offending data state (e.g., logic "1" or logic "0"). Each time the memory cell is read when it was most recently written with the offending data state, the cell will read in error. Examples of a mechanism for hard errors are open circuits or short circuits within a memory cell. Another example is a malformed component of a memory cell which may occur during IC fabrication, for example a malformed transistor. Some mechanisms for hard errors occur after the memory is formed and after the memory has been operative for a period of time, for example time-dependent oxide breakdown (which can produce short circuits) or electromigration-induced open circuits.

SUMMARY OF THE INVENTION

Illustrative embodiments of the present invention provide techniques for improving reliability of an IC including a memory circuit without significantly impacting performance of the memory circuit. To accomplish this, embodiments of the invention advantageously utilize results from error-correcting code (ECC) circuitry in the memory circuit for storing the location of a defective memory element and concurrently implementing a replacement of the defective memory element based on the ECC results. In this manner, the memory circuit is not left vulnerable to unrepeatable or inconsistent soft errors, since ECC correction is limited in the number of defective bits that can be repaired.

In accordance with one aspect of the invention, a memory circuit includes a memory comprising a plurality of primary memory elements, and an error correction circuit coupled to the memory and operative to detect an error in at least a given one of the primary memory elements and to provide corrected data corresponding to the given primary memory element. The memory circuit further includes at least one spare memory element and a control circuit operative to replace at least one of the primary memory elements with the spare memory element as a function of results generated by the error correction circuit. The memory circuit may be embodied in an IC including one or more of such memory circuits.

In accordance with another aspect of the invention, a method of operating a memory circuit so as to improve reliability of the memory circuit includes the steps of: detecting an error in at least a given one of the plurality of memory elements; providing corrected data corresponding to the given memory element; providing a location of the given memory element in which the error is detected; replacing the given memory element in which the error is detected with a spare memory element; writing the corrected data to the spare memory element; and storing the location of the given memory element in which the error is detected into a repair information memory.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein.

Figure 1:
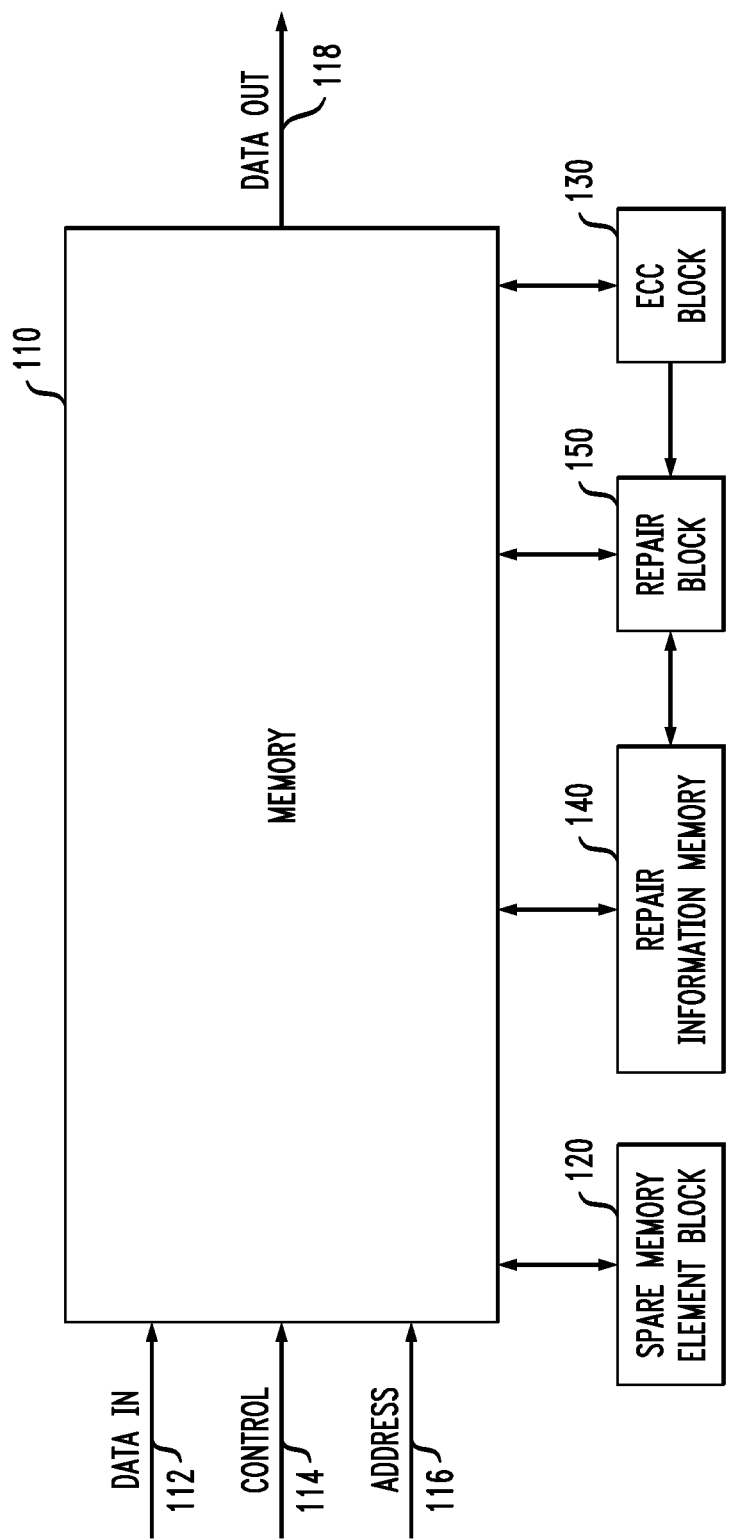
FIG. 1 is a functional block diagram depicting at least a portion of an exemplary memory circuit, according to an embodiment of the present invention.

It is to be appreciated that elements in the figures are illustrated for simplicity and clarity. Common but well-understood elements that may be useful or necessary in a commercially feasible embodiment may not be shown in order to facilitate a less obstructed view of the illustrated embodiments.

DETAILED DESCRIPTION OF THE INVENTION

Aspects of the present invention will be described herein in the context of illustrative embodiments of a memory circuit and method for operating a memory circuit which facilitates the repair of memory elements that have become inoperative, for example, due to wear-out mechanisms (e.g., electromigration and component parameter drift). It is to be appreciated, however, that the techniques of the present invention are not limited to the specific method and circuits shown and described herein. Rather, embodiments of the invention are directed broadly to techniques for beneficially enhancing reliability in a memory circuit without significantly impacting performance of the memory circuit. For this reason, numerous modifications can be made to these embodiments and the results will still be within the scope of the invention. No limitations with respect to the specific embodiments described herein are intended or should be inferred. Although preferred embodiments of the invention may be fabricated in a silicon wafer, embodiments of the invention can alternatively be fabricated in wafers comprising other materials, including but not limited to gallium arsenide (GaAs), indium phosphide (InP), etc.

Aspects of the present invention advantageously provide a memory circuit having improved reliability and performance. The memory circuit may comprise, for example, an embedded memory (e.g., a memory embedded within an IC) or a stand-alone memory (e.g., a memory that is the primary component within an IC). The memory may be a volatile memory, a non-volatile memory or a memory comprising both volatile and non-volatile memory elements. Examples of volatile memory are static random access memory (SRAM) and dynamic random access memory (DRAM). Examples of non-volatile memory are read only memory (ROM), flash memory, one-time programmable (OTP) memory, few-times programmable (FTP) memory, and phase change memory (PCM).

As previously stated, in the context of a memory circuit, a hard error is a non-transient failure mechanism which causes consistently erroneous reads from a memory cell or cells. There is a class of hard errors, which may be termed transient hard errors, which define errors that occur repeatably over some prescribed period of time. This period of time is longer than that required to read the memory once, but may be only long enough to read the erroneous memory cell a number of times, at least two of which are reads that produce incorrect data. Thus, a transient hard error is indicative of a failure mechanism which results in more frequent erroneous reads from a memory cell compared to soft errors, but does not yield erroneous reads as consistently as in the case of hard errors.

One illustrative mechanism that can cause transient hard errors is a failure mechanism that has associated drift. An example of such a drift mechanism is oxide leakage, or more generally insulator leakage, that occurs within the oxide (or, more generally, the insulator) of a storage capacitor within a DRAM cell. This drift mechanism can cause leakage in the insulator to occur and then to not occur; for example, a drift mechanism associated with the filling and emptying of charge traps, or a drift mechanism associated with insulator healing by the filling or emptying of traps. Other examples of drift mechanisms will become apparent to those skilled in the art.

Memories which do not employ techniques of the invention described herein, such as, for example, certain embedded DRAM (eDRAM), may include internal error correction using ECC circuitry, or alternative error correction means. The ECC circuitry is built into the memory device or circuit. In the case of certain eDRAM and other memory, the ECC is used to detect and repair single bit errors caused by memory defects or marginal memory cells that are on the tail end of a distribution of a cell characteristic, such as, for example, cell storage capacitance. Without using ECC, the production yield of good memories would, in some cases, be unacceptably low. Furthermore, ECC can be used to detect and repair transient hard errors. Without the detection and repair of transient hard errors, the quality level or reliability level of the memories would be unacceptably low. ECC can also be used to detect and repair soft errors.

In addition to, or in place of, ECC circuitry included within a memory circuit, ECC can be used at a system level. The system which utilizes ECC may be included within a single IC, termed a system-on-chip (SOC), contained within a plurality of ICs, or it may be of a larger scale comprising at least one IC and other circuitry external to the IC. System level ECC, by definition, is typically not internal to the functional memory device itself, although it may or may not be contained within the same IC that comprises the memory device. System level ECC is generally not intended to repair hard errors or even transient hard errors in a memory circuit, but rather is usually intended to repair soft errors. In some cases, system requirements are such that ECC internal to the memory, used to repair hard and/or transient hard errors, is undesirable. One reason for this is that in memory elements with hard or transient hard errors, providing data that is repaired by ECC leaves the memory vulnerable to unrepeatable or inconsistent soft errors, as ECC is limited in the number of defective bits that can be repaired. This may be unacceptable for some high-reliability systems.

With reference first to FIG. 1, a functional block diagram depicts at least a portion of an exemplary memory circuit 100, according to an embodiment of the present invention. Memory circuit 100 comprises a memory 110 adapted to receive a data signal (DATA IN) via a first connection 112, which may be a data input connection, a control signal (CONTROL) via a second connection 114, which may be a control connection, and an address signal (ADDRESS) via a third connection 116, which may be an address connection. Memory 110 is operative to generate, as an output thereof, a data output signal (DATA OUT) which is conveyed via a fourth connection 118, which may be a data output connection. Alternative means for conveying data and/or other signals (e.g., control signals) between the memory 110 and an external circuit or functional block are similarly contemplated. Although each of the data input, control, address and data output connections 112, 114, 116 and 118, respectively, is depicted as a single wire, one or more of these connections may comprise a plurality of wires and may therefore be considered a bus connection. This is particularly true, for example, when addressing a byte or word of memory cells, each of which comprises multiple bits of data.

The memory circuit 100 further comprises a spare memory element block 120, an ECC block 130, or alternative error correction circuitry, a repair information memory 140 and a repair block 150, or an alternative control circuit. Each of these functional blocks, which will be described in further detail herein below, are operatively coupled to memory 110 and may additionally be coupled to another of the functional blocks. For example, the ECC block 130 is preferably coupled to both the memory 110 and the repair block 150, and the repair block may be additionally coupled to the memory 110 and the repair information memory 140 for conveying information (e.g., data and/or control signals) therebetween. Although illustrated as separate functional blocks for ease of explanation, it is to be understood that one or more of these blocks may be combined with and/or incorporated into one or more other functional blocks operative to perform functions of the combined blocks, according to embodiments of the invention.

Memory 110 may comprise any of a variety of memory types, such as, for example, DRAM, static random access memory (SRAM), flash memory, read only memory (ROM), phase change memory (PCM), volatile memory, and/or non-volatile memory. The memory 110 preferably comprises a plurality of primary memory elements including memory cells, or alternative storage elements, as well as other circuitry coupled to the memory elements, such as, for example, control circuitry (e.g., row and column decoders), sense amplifiers, etc. Each primary memory element preferably includes a plurality of memory cells. For example, a primary memory element may include a plurality of memory cells storing data associated with a given byte or word. Alternatively, a primary memory element may comprise a row, a column, a plurality of rows, or a plurality of columns within an array of memory cells (e.g., a memory array).

Each of the rows and columns may comprise a plurality of memory cells. A primary memory element preferably comprises a message portion, which includes primary memory cells adapted for storing data addressable within a normal (working) address space of the memory circuit (e.g., selectable via the address signal supplied to the memory 110) and an ECC portion which includes memory cells adapted for storing ECC information. Other prescribed subsets of the memory cells corresponding to a given primary memory element may be designated for performing other functions, according to embodiments of the invention. In the context of an error correction scheme, ECC, sometimes referred to as forward error correction (FEC) code, is redundant data that is added to the message portion of a given word in the memory. Assuming the number of errors is within the capability of the code employed, the memory can use the redundant information to detect and correct errors in an addressed word of memory. Suitable ECC may include, but is not limited to, cyclic redundancy check (CRC) codes, Hamming codes, Huffman codes, etc.

Data (DATA IN) is preferably supplied to the memory 110 via the data input connection 112 for writing into the memory at cells identified by addressed memory locations. The memory cells, bytes, words, or primary memory elements to be written are selected as a function of the address signal (ADDRESS) supplied to the address connection 116 of the memory 110. The address signal may also be used to select spare memory elements to be written, in the event an error is detected in the memory 110 and a memory element replacement is implemented. The control signal (CONTROL) supplied to the control connection 114 of the memory 110 provides a means of controlling the memory and may comprise, for example, a clock, read enable, write enable, memory enable, refresh, and/or other control signals. Read data is output from the memory 110 on the data output connection 118.

The spare memory element block 120 preferably comprises one or more spare memory elements. Although a spare memory element may comprise a single memory cell, a given spare memory element preferably comprises a plurality of memory cells, for example, memory cells adapted for storing data associated with a byte or a word. Alternatively, a spare memory element may comprise a row, a column, a plurality of rows, or a plurality of columns. In other embodiments, a spare memory element may include an array of memory cells. The plurality of memory cells in a spare memory element are preferably not used for primary data storage (at least not initially), but rather are available and used to replace defective primary memory elements or memory elements comprising cells in the memory 110 that present erroneous data.

Spare memory elements in the spare memory element block 120 are not initially coupled to the memory 110, and hence cannot be accessed (e.g., written to or read from) within a primary address space of the memory. Like a primary memory element in memory 110, a first prescribed subset of the memory cells corresponding to a spare memory element in the spare memory element block 120 may be designated for storing data, addressable within a normal address space of the memory circuit 100, and a second prescribed subset of the memory cells corresponding to the spare memory element may be designated for storing ECC information. Other prescribed subsets of the memory cells corresponding to a spare memory element may be designated for performing other functions, according to embodiments of the invention.

With continued reference to FIG. 1, ECC block 130 is preferably operative to generate ECC information to be appended to the data written into a primary or spare memory element. In one embodiment, ECC block 130 presents the ECC information to the memory 110 for writing, along with the data, into the primary or the spare memory element. ECC block 130 preferably also receives data and ECC read from a given primary or a spare memory element, calculates what the read ECC should be for the data read, and compares the predicted ECC to the ECC actually read from the corresponding memory element. When the predicted ECC and the read ECC match, there is no error detected and no further action is taken by the ECC block 130 or by the repair block 150. Alternatively, when the predicted ECC and the read ECC do not match, this is indicative of an error, and the corresponding primary or spare memory element containing the erroneously read data is flagged as defective by the ECC block 130. Hence, when an error is detected, the ECC block 130 corrects the data and passes the corrected data back to the memory 110 for outputting via output connection 118. In parallel with supplying the corrected data, the ECC block 130 preferably stores the location of the defective memory element for performing a replacement of the defective memory element with a spare memory element.

Repair block 150 preferably comprises a state machine, or an alternative controller, operative to implement a hard memory repair (e.g., physical memory element replacement). When the ECC block 130 flags a primary or spare memory element as defective, the repair block 150 initiates a repair of the memory 110 by at least partially decoupling, from at least a portion of the memory, the defective primary or spare memory element and coupling a new (i.e., operable or non-defective) spare memory element to the memory. To accomplish this, a control signal may be supplied to the repair block 150 to indicate, based on results from the ECC block 130, that an error has been detected. The defective primary or spare memory element is at least partially decoupled from at least a portion of memory 110 so that when addressed, the defective memory element will not be accessed; that is, the defective memory element will not be read from, written to, or refreshed.

In place of the defective memory element, the new spare memory element is coupled to memory 110 so that the new spare memory element is accessed in place of the defective memory element. To initiate the replacement of the defective memory element, one or more control signals are preferably passed between the memory 110 and the repair block 150. In one embodiment, read data presented on data output connection 118 is not corrected by the ECC block 130. In another embodiment read data presented on data output connection 118 is corrected by the ECC block 130.

Repair block 150 is preferably coupled to the repair information memory 140 such that at least one data and/or control signal is passed therebetween. The repair information memory 140 preferably stores the addresses of the defective primary memory elements that have been replaced by spare memory elements. Thus, in accordance with an embodiment of the invention, the repair block 150 is operative to obtain the location(s) of the defective primary memory element(s) from the repair information memory 140 and to replace such defective memory elements with corresponding spare memory elements from the spare memory element block 120. The respective locations of defective memory elements may be stored in the repair information memory 140 in the form of a look-up table, although alternative storage means for storing the location of defective memory elements are similarly contemplated (e.g., blowing fuse links, etc.).

The repair information memory 140 preferably comprises nonvolatile memory so that the repair information is retained when power is removed from the memory circuit 100, such as during power-down. Nonvolatile memory suitable for use in the repair information memory 140 includes, but is not limited to, flash memory, PCM, one-time programmable (OTP) memory, few-times programmable (FTP) memory, fuse memory, anti-fuse memory, etc. Alternately, the repair information memory 140 may comprise volatile memory, such as SRAM or DRAM. In this case, repair information will be lost when power is removed from the memory circuit 100, and the memory circuit is repaired, after power is reapplied, according to methods of the invention (e.g., method 200 described in further detail below in conjunction with FIG. 2). The repair of memory circuit 100, after power is reapplied, may comprise repairing memory elements that had been previously repaired before power was removed.

Figure 2:
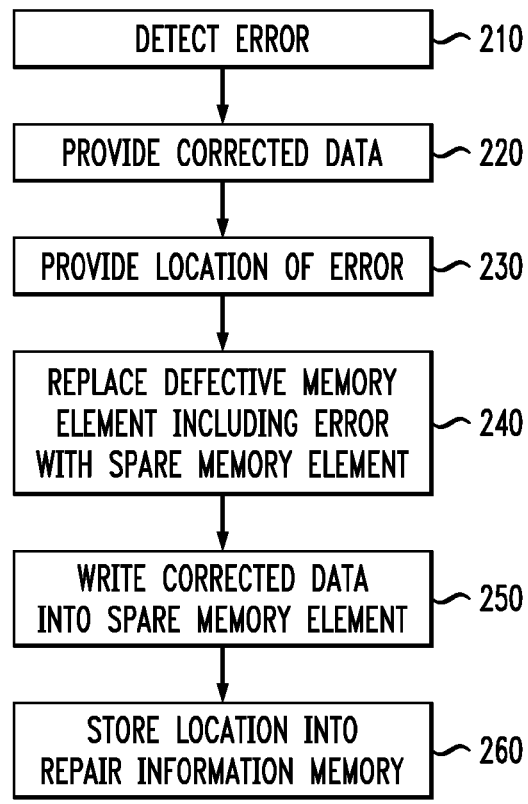
FIG. 2 is a flow diagram depicting steps in an exemplary method for repairing a memory circuit, according to an embodiment of the present invention.

With reference now to FIG. 2, a flow diagram is shown depicting an exemplary method 200 for repairing a memory circuit (e.g., memory circuit 100 shown in FIG. 1), according to an embodiment of the invention. Alternative methodologies for repairing a memory circuit are similarly contemplated that are within the scope of the invention, as will become apparent to those skilled in the art given the teachings herein. In step 210, an error is detected in at least one memory element in the memory circuit. The memory element in which the error is detected may comprise a primary memory element, addressable within a normal address space of the memory circuit (e.g., accessible via an address signal supplied to the memory circuit), or it may comprise a spare memory element (e.g., included in a spare memory element block 120 in FIG. 1). The error may be detected using ECC, for example, by ECC block 130, as described above in connection with FIG. 1.

In step 220, corrected data is provided corresponding to the memory element in which the error was detected in step 210. In accordance with an embodiment of the invention, step 220 may be performed, for example, by ECC block 130, as described above in connection with FIG. 1. The memory element preferably includes a first portion, which may be a message portion, for storing data and a second portion, which may be an ECC portion, for storing ECC information corresponding to the data in the memory element. By comparing a predicted ECC, which can be determined as a function of the corresponding data portion of a given memory element, with the ECC actually read from the ECC portion of the given memory element, an error from a single memory cell within the message or ECC portions of the given memory element can be corrected.

In step 230, a location of the detected error is provided as a function of results from the error correction in step 220. The location preferably comprises an address, or alternative unique identification, of the primary or spare memory element that contains the cell producing the error detected in step 210. The defective primary or spare memory element is replaced with a spare memory element in step 240. Corrected data is written into the spare memory element that replaced the defective primary or spare memory element in step 250. In step 260, the location of the defective primary or spare memory element is preferably stored, such as by writing the location into a repair information memory, such as, for example, repair information memory 140, as described above in connection with FIG. 1.

Figure 3:
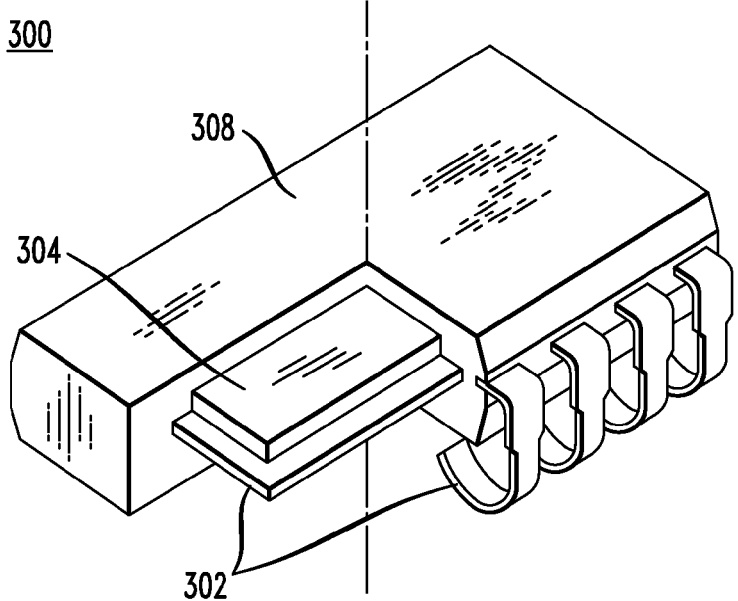
FIG. 3 is a partial sectional view depicting an exemplary packaged IC comprising at least one memory circuit, according to an embodiment of the present invention.

At least a portion of the techniques of the present invention may be implemented in one or more integrated circuits. In forming integrated circuits, die are typically fabricated in a repeated pattern on a surface of a semiconductor wafer. Each of the die includes a device described herein, for example, described in FIGS. 1 and 2, and may include other structures or circuits. Individual die are cut or diced from the wafer, then packaged as integrated circuits. FIG. 3 is a partial sectional view depicting an exemplary packaged IC 300 comprising at least one memory device according to an embodiment of the present invention. The packaged IC 300 comprises a leadframe 302, a die 304 attached to the leadframe, the die including a memory device in accordance with an embodiment of the invention, and a plastic encapsulation mold 308. One skilled in the art would know how to dice wafers and package die to produce integrated circuits. Integrated circuits so manufactured are considered part of this invention.

A semiconductor structure formed in accordance with an illustrative embodiment of the invention for implementing techniques of the present invention comprises a first integrated circuit die and at least a second integrated circuit die mechanically mounted proximate to and electrically interconnected with the first integrated circuit die in a known manner. In the case of a multiple-die implementation, reference number 304 depicted in FIG. 3 will be indicative of a semiconductor structure including a plurality of integrated circuit die. An illustrative embodiment of this application includes, but is not limited to, flip-chip and multi-chip module (MCM) technology. The means of electrical interconnection contemplated by the invention is not limited and may include, for example, utilizing solder bumps, wire bonding, etc. For example, the first and second integrated circuit die used in the semiconductor structure may be electrically interconnected using a plurality of solder bumps, or alternative conductive structures, each solder bump being formed between a bonding site on the first integrated circuit die and a corresponding bonding site on the second integrated circuit die, as will be understood by those skilled in the art.

By way of example only and without loss of generality, the first integrated circuit die may include a processor (e.g., central processing unit (CPU), microprocessor, digital signal processor (DSP), etc.) and the second integrated circuit die may include a memory circuit utilized by the processor. One or more of the integrated circuit die includes a high-reliability memory circuit formed in accordance with an embodiment of the invention described herein. Semiconductor structures so manufactured are also considered part of this invention.

An integrated circuit in accordance with the present invention can be employed in any application and/or electronic system which utilizes memory. Suitable systems for implementing the invention may include, but are not limited to, personal computers, communication networks, electronic commerce systems, portable communications devices (e.g., cell phones), solid-state media storage devices, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A memory circuit, comprising:
   a memory including a plurality of primary memory elements;
   an error correction circuit coupled to the memory and operative to detect an error in at least one of the primary memory elements and to provide corrected data corresponding to the at least one primary memory element;

at least one spare memory element; and a control circuit operative to replace at least one of the plurality of primary memory elements with the at least one spare memory element as a function of results generated by the error correction circuit;

wherein the control circuit is further operative to indicate a given one of the memory elements as defective based at least in part on data read from a first portion of the given memory element, error correction information read from a second portion of the given memory element, and predicted error correction information determined for the data read from the first portion of the given memory element.

2. The memory circuit of claim 1, wherein the error correction circuit is operative to detect an error in at least one of the primary memory elements using error-correcting code (ECC) information.

3. The memory circuit of claim 1, wherein the results generated by the error correction circuit comprise a location of the at least one of the plurality of primary memory elements indicated by the error correction circuit as having generated the error.

4. The memory circuit of claim 1, wherein each of the plurality of primary memory elements comprises a first portion configured for storing data and a second portion configured for storing ECC information corresponding to the data stored in the first portion.

5. The memory circuit of claim 1, further comprising a repair information memory configured for storing a location of the at least one of the plurality of primary memory elements indicated by the error correction circuit as having generated the error.

6. The memory circuit of claim 5, wherein the repair information memory comprises non-volatile memory.

7. The memory circuit of claim 5, wherein the repair information memory comprises at least one fuse link.

8. The memory circuit of claim 1, wherein the error correction circuit is operative to generate ECC information to be appended to data written into at least one of a primary memory element and a spare memory element.

9. The memory circuit of claim 1, wherein the control circuit is operative: to receive data and error-correcting code (ECC) information read from a given memory element; to determine predicted ECC information corresponding to the data read from the given memory element; to compare the predicted ECC information to the ECC information read from the given memory element; and, when the predicted ECC information and the ECC information read from the given memory element do not match, to indicate the given memory element as being defective.

10. The memory circuit of claim 9, wherein the given memory element comprises at least one of a primary memory element and a spare memory element.

11. The memory circuit of claim 1, wherein when an error is detected in a given memory element, the error correction circuit is operative: to correct data corresponding to the given memory element; and to store a location of the given memory element for performing a replacement of the given memory element with the at least one spare memory element.

12. An integrated circuit comprising at least one memory circuit according to claim 1.

13. A method for repairing a memory circuit including a plurality of memory elements, the method comprising the steps of:

detecting an error in at least a given one of the plurality of memory elements;

providing corrected data corresponding to the given memory element;

providing a location of the given memory element in which the error is detected;

replacing the given memory element in which the error is detected with a spare memory element;

writing the corrected data to the spare memory element; and storing the location of the given memory element in which the error is detected;

wherein the given one of the plurality of memory elements comprises a first portion for storing data and a second portion for storing error correction information, the step of detecting an error in the given one of the plurality of memory elements comprising detecting the error based at least in part on data read from the first portion of the given memory element, error correction information read from the second portion of that memory element, and predicted error correction information determined for the data read from the first portion of the given memory element.

14. The method of claim 13, wherein the given one of the plurality of memory elements comprises a first portion for storing data and a second portion for storing error-correcting code (ECC) information corresponding to the data stored in the first portion, the step of detecting an error in the given one of the plurality of memory elements comprising reading the data stored in the first portion of the given memory element, generating first ECC information corresponding to the data read from the first portion, and comparing the generated ECC information with second ECC information stored in the second portion of the given memory element, a difference between the first and second ECC information indicating the presence of an error in the given memory element.

15. The method of claim 13, wherein the step of providing corrected data comprises comparing predicted error correction code (ECC) information for a given memory element determined as a function of a corresponding data portion of the given memory element, with ECC information read from an ECC portion of the given memory element.

16. The method of claim 15, wherein the step of providing a location of the given memory element in which the error is detected is performed as a function of ECC results generated from the step of providing corrected data.

17. The method of claim 13, wherein the step of storing the location of the given memory element in which the error is detected comprises storing the location of the given memory elements in which the error is detected in a repair information memory.

18. The method of claim 17, wherein the location of the given memory element is stored in the repair information memory in a form of a look-up table.

19. An electronic system, comprising:

at least one integrated circuit including an embedded memory circuit, the embedded memory circuit comprising:

a memory including a plurality of primary memory elements;

an error correction circuit coupled to the memory and operative to detect an error in at least one of the primary memory elements and to provide corrected data corresponding to the at least one primary memory element;

at least one spare memory element; and a control circuit operative to replace at least one of the plurality of primary memory elements with the at least one spare memory element as a function of results generated by the error correction circuit;

wherein the control circuit is further operative to indicate a given one of the memory elements as defective based at least in part on data read from a first portion of the given memory element, error correction information read from a second portion of the given memory element, and predicted error correction information determined for the data read from the first portion of the given memory element.

20. A semiconductor structure, comprising:

a first integrated circuit die; and at least a second integrated circuit die mechanically mounted proximate to and electrically interconnected with the first integrated circuit die, at least one of the first and at least second integrated circuit die including a memory circuit comprising:

a memory including a plurality of primary memory elements;

an error correction circuit coupled to the memory and operative to detect an error in at least one of the primary memory elements and to provide corrected data corresponding to the at least one primary memory element;

at least one spare memory element; and a control circuit operative to replace at least one of the plurality of primary memory elements with the at least one spare memory element as a function of results generated by the error correction circuit;

wherein the control circuit is further operative to indicate a given one of the memory elements as defective based at least in part on data read from a first portion of the given memory element, error correction information read from a second portion of the given memory element, and predicted error correction information determined for the data read from the first portion of the given memory element.

\* \* \* \* \*